(12) United States Patent
Wooldridge

(10) Patent No.: US 7,061,810 B2
(45) Date of Patent: Jun. 13, 2006

(54) ERASING FLASH MEMORY WITHOUT PRE-PROGRAMMING THE FLASH MEMORY BEFORE ERASING

(75) Inventor: Corley B. Wooldridge, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 676 days.

(21) Appl. No.: 09/974,219

(22) Filed: Oct. 9, 2001

(65) Prior Publication Data

US 2003/0067809 A1    Apr. 10, 2003

(51) Int. Cl.
*G11C 16/14* (2006.01)

(52) U.S. Cl. .......................... 365/185.24; 365/185.29; 365/185.3; 365/185.33; 365/185.22

(58) Field of Classification Search ........... 365/185.24, 365/185.3, 185.33, 185.29, 185.22
See application file for complete search history.

(56) References Cited

U.S. PATENT DOCUMENTS

| | | | |
|---|---|---|---|
| 5,636,166 A | 6/1997 | Roohparvar | 365/194 |
| 5,680,350 A | 10/1997 | Lee | 365/185.24 |
| 5,784,316 A | 7/1998 | Hirata | 365/185.22 |
| 5,801,985 A | 9/1998 | Roohparvar et al. | 365/185.01 |
| 5,822,252 A | 10/1998 | Lee et al. | 365/185.3 |
| 5,901,108 A | 5/1999 | Roohparvar | 365/233 |
| 5,901,194 A | 5/1999 | Chevallier | 377/20 |
| 5,963,480 A | 10/1999 | Harari | 365/185.29 |
| 6,020,775 A | 2/2000 | Chevallier | 327/393 |
| 6,081,575 A | 6/2000 | Chevallier | 377/20 |
| 6,115,291 A | 9/2000 | Lakhani | 365/185.3 |
| 6,148,435 A | 11/2000 | Bettman | 716/16 |
| 6,188,613 B1 | 2/2001 | Manning | 365/185.33 |
| 6,229,736 B1* | 5/2001 | Song | 365/185.29 |
| 6,240,023 B1 | 5/2001 | Roohparvar | 365/185.3 |
| 6,248,629 B1 | 6/2001 | Liu et al. | 438/258 |
| 6,260,104 B1 | 7/2001 | Roohparvar | 711/103 |
| 6,272,586 B1 | 8/2001 | Roohparvar et al. | 711/103 |
| 6,356,974 B1 | 3/2002 | Chevallier | 711/103 |
| 6,457,093 B1 | 9/2002 | Roohparvar | 711/103 |
| 6,515,909 B1 | 2/2003 | Wooldridge | 365/185.22 |
| 6,570,790 B1 | 5/2003 | Harari | 365/185.29 |
| 6,587,903 B1 | 7/2003 | Roohparvar | 710/104 |
| 6,608,778 B1* | 8/2003 | Liu et al. | 365/185.28 |
| 6,614,695 B1 | 9/2003 | Keays | 365/185.33 |
| 2003/0039152 A1* | 2/2003 | Shum et al. | 365/200 |

OTHER PUBLICATIONS

Basinski, E, "Computer Program Product Claims Allowed by the European Patent Office—Impact on Software Patent Claiming", http://library.findlaw.com/1999/Mar/1/128760.html.*

* cited by examiner

*Primary Examiner*—Andrew Q. Tran
(74) *Attorney, Agent, or Firm*—Schwegman, Lundberg, Woessner & Kluth, P.A.

(57) ABSTRACT

An erase operation in a flash memory device includes applying an erase pulse to memory cells of the flash memory device to convert the contents of the memory cells into logic 1 bits before any pre-programming operation is performed.

27 Claims, 6 Drawing Sheets

US 7,061,810 B2

ERASING FLASH MEMORY WITHOUT PRE-PROGRAMMING THE FLASH MEMORY BEFORE ERASING

TECHNICAL FIELD OF THE INVENTION

The present invention relates generally to memory devices, and in particular, to an erase operation of a flash memory device.

BACKGROUND OF THE INVENTION

Flash memory devices include a variety of programmable devices such as electrically programmable and electrically erasable/programmable random access memory (EPROM) and (EEPROM) devices. Besides their use to store basic input-output system (BIOS) codes in computers, flash memory devices increasingly gain popularity for use as memory cards or flash cards to store data in electronic products including digital camcorders, digital cameras, and wireless devices.

A typical flash memory device includes a number of memory cells. Each memory cell stores a bit of data in form of a logic 0 bit or logic 1 bit. The flash memory device performs a write operation to store data into the memory cells. To erase the stored data, the flash memory device performs an erase operation to convert the contents of all of the memory cells into logic 1 bits.

A typical flash memory device performs the erase operation in two main steps. In the first step, the flash memory device performs a pre-programming cycle to convert the contents of all memory cells into logic 0 bits. In the second step, the flash memory device performs an erase cycle to convert the contents of all memory cells into logic 1 bits. In a typical flash memory device, some memory cells hold data as logic 1 bits. Therefore, in the typical erase operation, it is not efficient to convert the contents of these memory cells into logic 0 bits in the pre-programming cycle then convert the bits back to logic 1 bits in the erase cycle.

For these and other reasons stated below, and which will become apparent to those skilled in the art upon reading and understanding the present specification, there is a need to improve the erase operation of a flash memory device.

SUMMARY OF THE INVENTION

The present invention includes a flash memory device having a controller to store instructions for the performing a method of erasing memory cells of the flash memory device.

In one aspect, the method includes applying an erase pulse to erase a plurality of memory cells. The method further includes pre-programming the memory cells only if a leakage occurs after the memory cells are erased.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
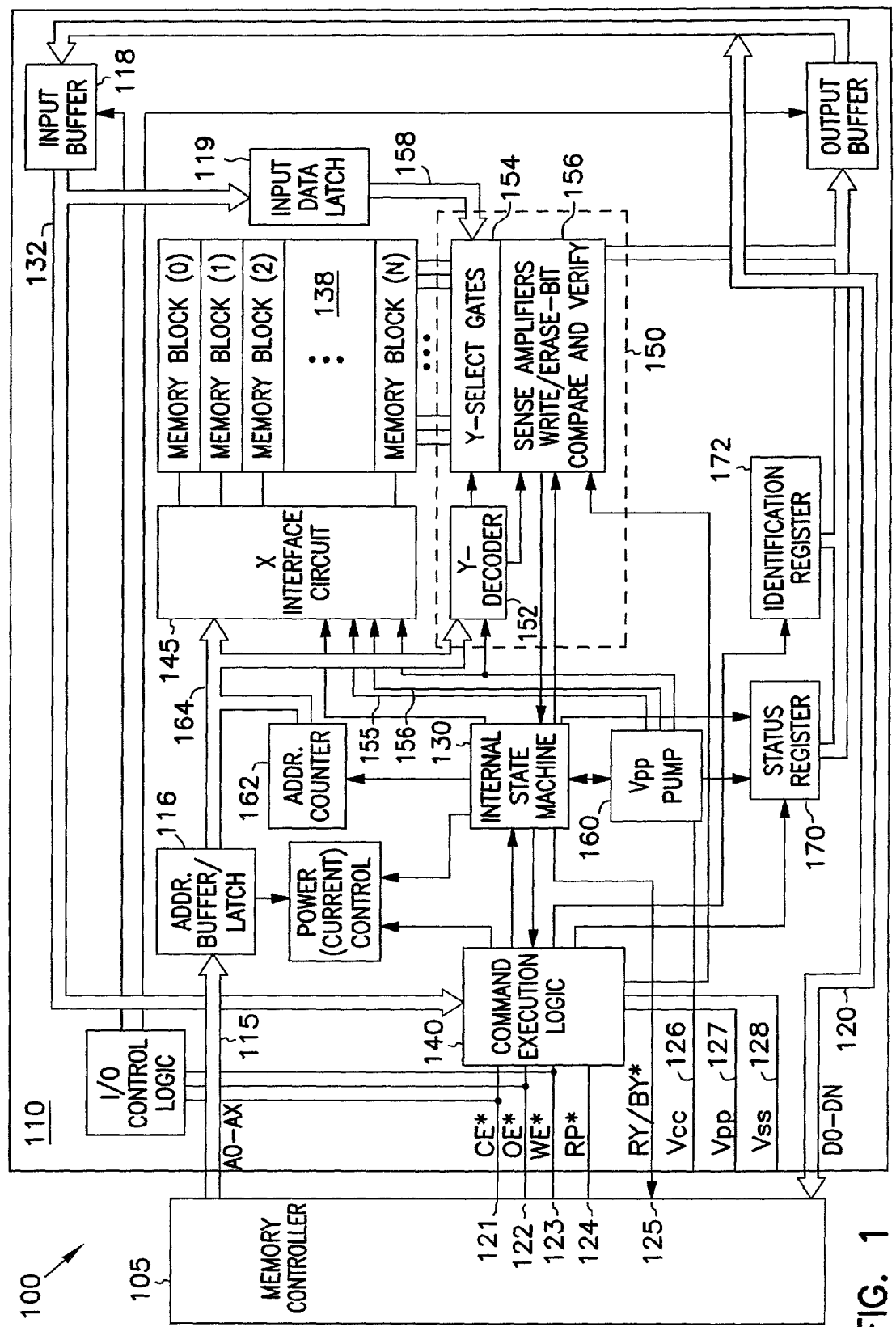
FIG. 1 is a block diagram of a flash memory system according to an embodiment of the invention.

FIG. 1 is a block diagram of a flash memory system 100 according to an embodiment of the invention. Memory system 100 includes a memory controller 105 and a flash memory integrated circuit (IC) 110. Controller 105 includes a control device such as a microprocessor or a processor to provide interface signals to IC 110. The interface signals include address signals A0–AX provided over multiple address lines 115 to an address buffer and latch 116, and data signals D0–DN provided over multiple data lines 120. Data lines 120 connects to an input buffer 118 which stores the D0–DN signals for transfer to an input data latch 119 over multiple internal data lines 132. Other interface signals provided by controller 105 include a chip enable signal CE* at node 121, an output enable signal OE* at node 122, a write enable signal WE* at node 123, and a reset/power-down signal RP* at node 124, all of which are active low signals. IC 110 provides a status signal RY/BY* to controller 105 at node 125 to indicate the status of an internal state machine 130. IC 110 also receives a positive power supply voltage $V_{CC}$ at node 126, a write/erase supply or programming voltage $V_{PP}$ at node 127, and a reference voltage such as a substrate ground voltage $V_{SS}$ at node 128. Each of the address lines 115, data lines 120, and nodes 121–128 is terminated at a pin (not shown) in IC 110 that may be coupled to controller 105 by a line such as a control line.

IC 110 includes an array 138 of floating gate transistor memory cells arranged in a number of memory cell blocks. A command execution logic module 140 receives the above-described interface signals from controller 105. Module 140 controls state machine 130 which controls individual acts necessary for programming, reading, and erasing the memory cells in array 138. More specifically, state machine 130 controls detailed operations of IC 110 such as providing write and block erase timing sequences to array 138 through an X-interface circuit 145 and a Y-interface circuit 150.

Y-interface circuit 150 provides access to individual memory cells through bit lines in array 138. Bit lines in Y-interface circuit 150 are connected to a bit line driver circuit (not shown). Y-interface circuit 150 includes a Y-decoder circuit 152, Y-select gates 154, and sense amplifiers and write/erase bit compare and verify circuits 156. X-interface circuit 145 provides access to rows of memory cells through word lines in array 138, which are electrically connected to control gates of the memory cells in array 138. X-interface circuit 145 includes decoding and control circuits for erasing the memory cells in array 138. The write/ erase bit compare and verify circuits 156 exchange data with input data latch 119 over a set of internal data lines 158.

IC 110 includes a pump circuit (Vpp pump) 160 to generate an elevated voltage Vpp for programming and erasing the memory cells in array 138. Pump circuit 160 connects to node 126 to receive the positive power supply voltage $V_{CC}$ and provides the voltage Vpp to X-interface circuit 145, Y-decoder circuit 152, and state machine 130. State machine 130 controls an address counter 162 which is capable of providing a sequence of addresses on an internal set of address lines 164 connected between address buffer and latch 116, X-interface circuit 145, and Y-decoder circuit 152.

IC 110 also includes a status register 170 to receive signals from state machine 130, module 140, and pump circuit 160. Bits in status register 170 indicate the status of IC 110, and controller 105 reads status register 170. IC 110 also includes an identification register 172 to receive signals from module 140.

Figure 2:
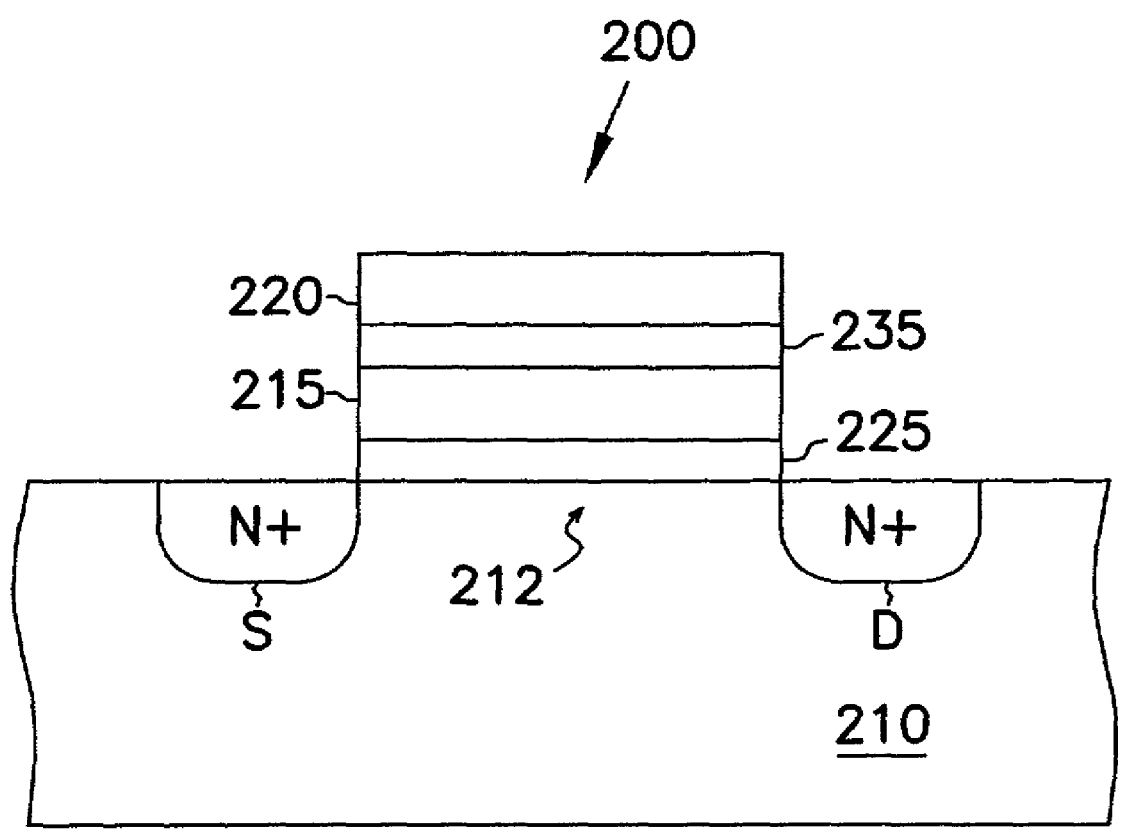
FIG. 2 is a cross-sectional view of a memory cell according to an embodiment of the invention.

FIG. 2 is a cross-sectional view of a memory cell 200 according to an embodiment of the invention. Memory cell 200 includes an n+-type source S and an n+-type drain D formed in a p-type silicon substrate 210, source S and the drain D are separated by a channel region 212 in substrate 210. Memory cell 200 includes a floating gate 215 and a control gate 220, both formed of doped polysilicon. Floating gate 215 is floating or electrically isolated. A layer of gate oxide 225 separates floating gate 215 from channel region 212 in substrate 210. An inter-poly dielectric layer 235 separates floating gate 215 from control gate 220. Substrate 210 may be silicon or another semiconductor material, or it may be a thin semiconductor surface layer formed on an underlying insulating portion, such as a semiconductor-on-insulator (SOI) structure or other thin film transistor technology. The source S and the drain D are formed by conventional complementary metal-oxide-semiconductor (CMOS) processing techniques.

Memory cell 200 of FIG. 2 is an n-channel floating gate transistor memory cell. In another embodiment of the invention, memory cell 200 may be a p-channel floating gate transistor memory cell with a p+-type source S and a p+-type drain D formed in an n-type silicon substrate 210.

Figure 3:
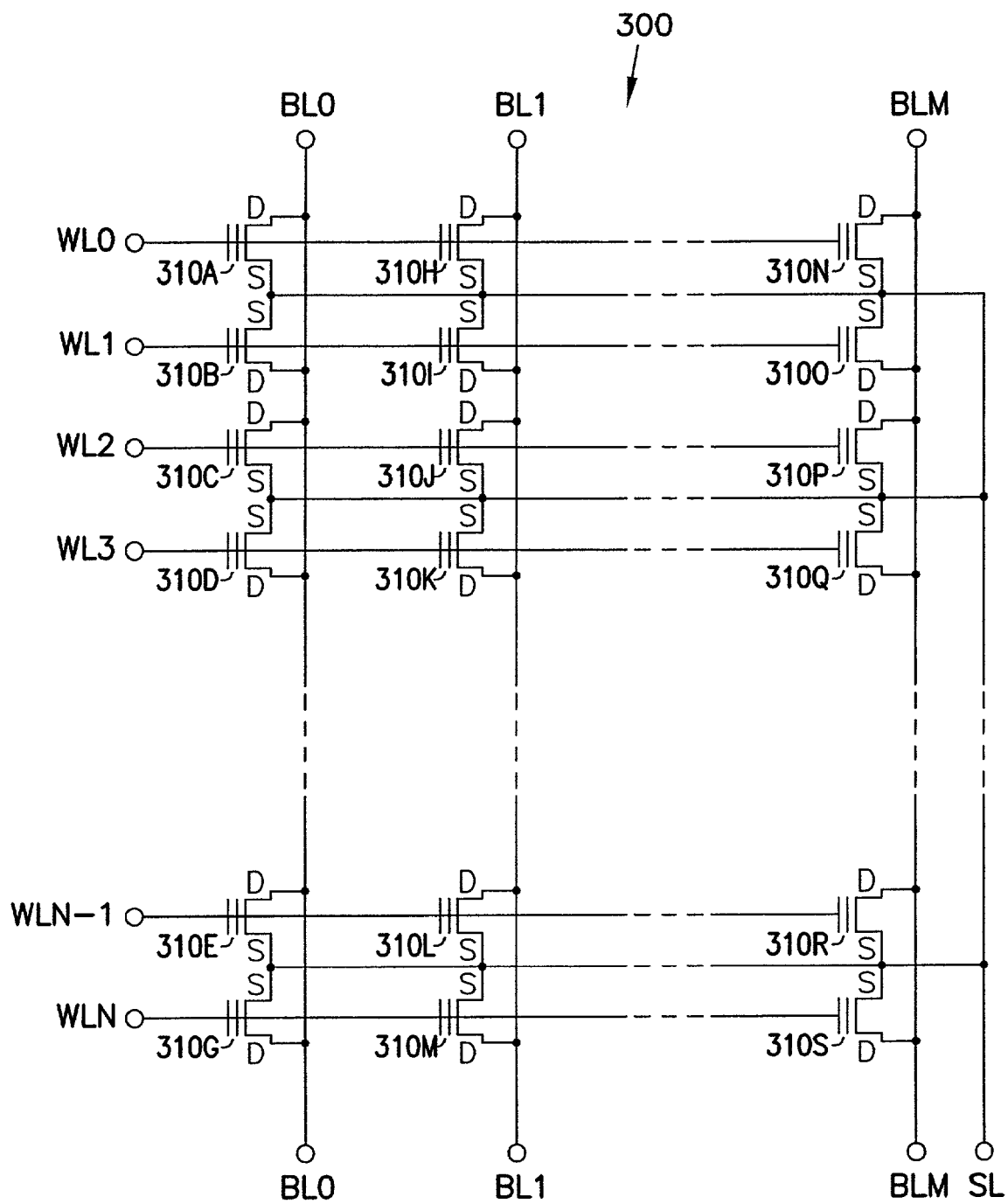
FIG. 3 is a schematic diagram of a block of memory cells in an array according to an embodiment of the invention.

FIG. 3 is a schematic diagram of a block 300 of memory cells 310A–310S in array 138. Some memory cells in block 300 are omitted from FIG. 3 for clarity. Memory cells 310 are arranged in rows and columns. All of the memory cells 310 in a particular column have drains D connected to a common bit line BL and all of the memory cells 310 in a particular row have control gates connected to a common word line WL. The bit lines BL are identified as BL0–BLM and the word lines WL are identified as WL0–WLN. All of the memory cells 310 in block 300 have sources S connected to a common source line SL. The remaining memory cells in array 138 are arranged into separate blocks having separate source lines.

Memory cells 310 are arranged in column pairs, with each memory cell 310 of the pair sharing a common source S. For example, a memory cell pair 310J and 310K have a common source S connected to the source line SL. The drains D of memory cells 310 are connected to the bit line BL associated with the column in which memory cells 310 are located. For example, memory cell pair 310J and 310K have their drains D connected to a common bit line BL1.

One of the memory cells 310A–310S in the block 300 is selected according to address signals A0–AX that identify the memory cell. The memory cell is selected by the X-interface circuit 145 that selects a word line and by the Y-interface circuit 150 that selects a bit line in response to the address signals. The word line and the bit line connect to the memory cell.

To program a selected one of the memory cells 310A–310S in the block 300, the ground voltage $V_{SS}$ (zero volts) is applied to the source line SL, a voltage of approximately 5–7 volts is applied to the bit line BL, and a high positive voltage programming pulse of approximately 10 volts is applied to the word line WL. Charge is applied to the floating gate of the memory cell when it is programmed. When a memory cells is programmed, it contains a logic 0 bit.

To read the data in a selected one of the memory cells 310A–310S in block 300, the ground voltage $V_{SS}$ is applied the source line SL, a voltage of approximately 1 volt is applied to the bit line BL, a voltage of approximately 5.4 volts is applied to the word line WL, and the current in the memory cell is sensed through the bit line BL. One of sense amplifiers 156 senses the current on the bit line BL. The sensed current is inversely related to the threshold voltage of the memory cell. The higher the threshold voltage, the less current is sensed in the memory cell, and vice versa.

To erase the data in a selected one of the memory cells 310A–310S in block 300, the source line SL is held at approximately 5 volts, the bit line BL is allowed to float unconnected, and erase pulse of approximately −10 volts is applied to the word line VWL. Charge is removed from the floating gate of the memory cell when it is erased. When a memory cell is erased, it contains a logic 1 bit.

Data in memory cells 310A–310S in the block 300 can also be erased by holding the word lines WL0–WLN to the ground voltage $V_{SS}$, allowing the bit lines BL0–BLM to float, and applying a high positive voltage erase pulse of approximately 12 volts to the sources S through the source line SL.

In this description, an erase pulse is a voltage applied to a control gate or a source of a memory cell to erase the memory cell. The length of the erase pulse is the period of time during which it is applied. The voltage of the erase pulse can remain approximately constant or vary for the length of the erase pulse. An erase pulse of approximately −10 volts may be applied to the control gate of the memory cell to erase the memory cell. In this method, approximately 5 volts is applied concurrently to the source, the substrate connects to a ground voltage reference, and the drain floats, or is electrically isolated when the erase pulse is applied to the control gate. An erase pulse of approximately 12 volts may instead be applied to the source of the memory cell to erase the memory cell. In this method, the substrate and the control gate connect to a ground voltage reference and the drain floats.

Figure 4:
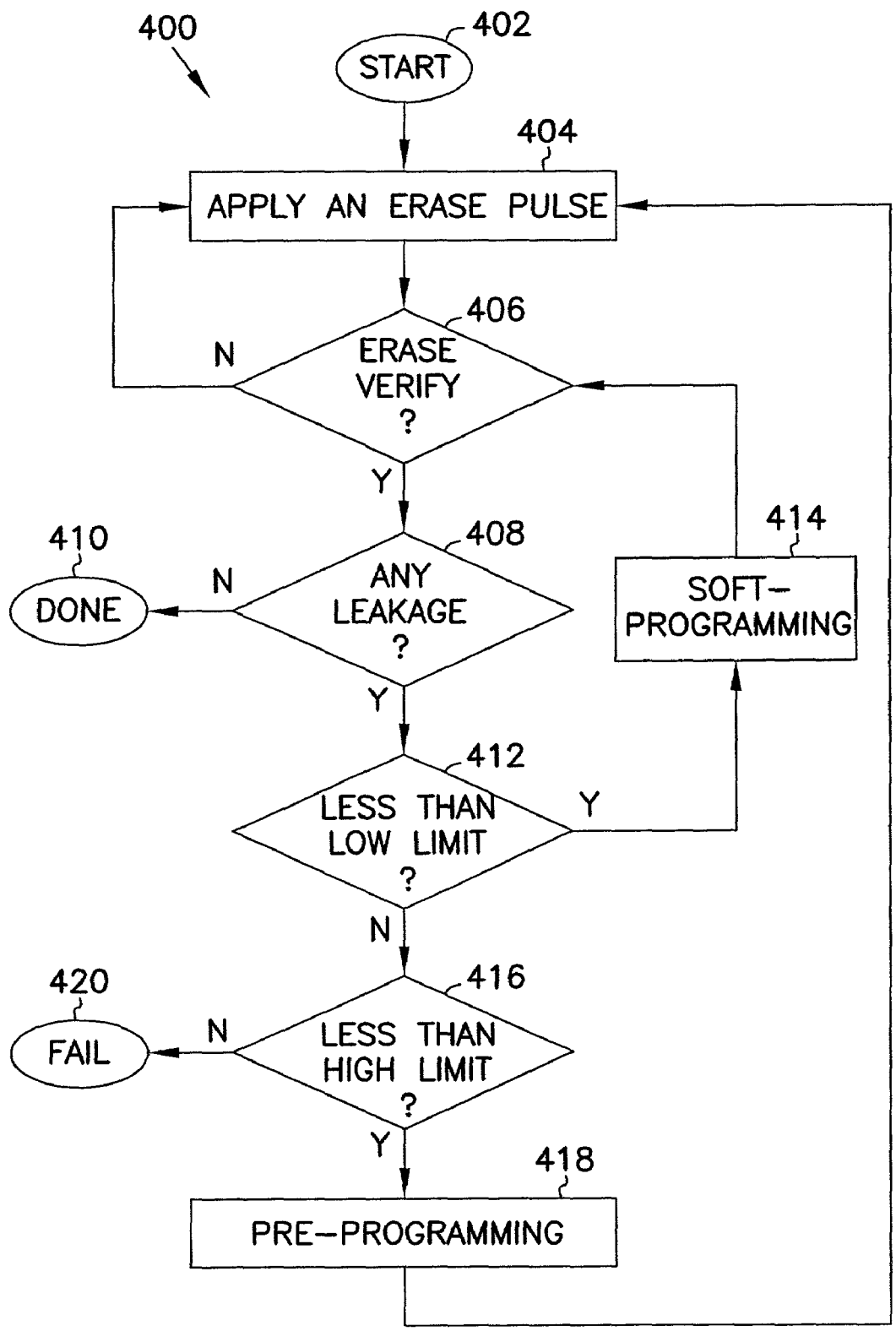
FIG. 4 is a flowchart of a method of erasing a flash memory device according to an embodiment of the invention.

FIG. 4 is a flowchart of a method 400 of erasing a flash memory device according to an embodiment of the invention. Method 400 starts an erase operation of the flash memory device at box 402. Box 404 applies an erase pulse to memory cells of the flash memory device to convert the content of the memory cells into logic 1 bits. Applying an erase pulse at box 404 is similar to erasing data in the memory cells described in FIG. 3. Box 404 applies an erase pulse of about −10 volts to the control gate of the memory cells, about 5 volts to the drain, and float the source. As an alternative, the erase pulse of about 12 volts can be applied to the source of the memory cells. In this case, the control gate is held at ground and the drain floats. Vpp pump circuit 160 of FIG. 1 provides the erase pulse. In method 400, applying an erase pulse at box 404 to erase data in the memory cells occurs before any pre-programming cycle is performed.

Box 406 performs an erase verify function to verify whether or not all of the memory cells are erased, i.e., to verify that all memory cells hold logic 1 bits. If all of the memory cells are not erased, method 400 repeats the function of box 404. If all of the memory cells are erased, method 400 proceeds to the function of box 408 to check for any leakage among the memory cells. In one embodiment, method 400 checks for leakage from a memory cell. In other embodiments, method 400 checks for leakage of an entire column of memory cells. To check for a leakage, current from each erase memory cells is read and sensed. The sensed current is compared to a reference current. The result of the comparison indicates whether or not a leakage occurs. Circuit 156 of FIG. 1 performs the erase verify and leakage check finctions at box 406 and 408.

If a leakage does not occur at box 408, method 400 completes the erase operation at box 410. However, if a leakage occurs, method 400 continues the erase operation with the function of box 412. Box 412 compares the number of memory cells having leakage with a low limit. If the number of memory cells having leakage is less than the low limit, method 400 performs a soft-programming cycle at box 414 to correct the leakage. The soft-programming cycle can be performed by a conventional soft-programming operation. For example, soft-programming applies a voltage of about 6 volts to the control gate, about 5 volts to the drain, and the ground voltage $V_{SS}$ to the source. After the soft-programming, method 400 repeats the erase verify function at box 406. If the number of memory cells having leakage is more than the low limit, method 400 moves from box 412 to box 416 to perform another comparison.

Box 416 compares the number of memory cells having leakage with a high limit. If the number of memory cells having leakage is less than the high limit, box 418 performs a pre-programming cycle to convert all logic 1 bits in the erased memory cells into logic 0 bits. The pre-programing cycle is similar to the programming of the memory cells described in FIG. 1. The pre-programming cycle can be performed by a conventional pre-programming operation. For example, pre-programming applies the ground voltage $V_{ss}$ to the source of the memory cells, a voltage of approximately 5–7 volts to the drain, and a high positive voltage programming pulse of approximately 10 volts to the control gate. After pre-programming, method 400 repeats the function of box 404. If the number of memory cells having leakage is more than the high limit, box 416 issues a fail message at box 420 to indicate that the flash memory device is defective, and terminates the erase operation.

In method 400, the low limit refers to a first predetermined quantity and the high limit refers to a second predetermined quantity. In the embodiment of FIG. 4, the first predetermined quantity is three and the second predetermined quantity is sixteen. In other embodiments, however, the first and second predetermined quantities can be other numerical values.

Method 400 decreases the time required for an erase operation and increases the lifetime of the flash memory device. Since the erase operation omits a conventional pre-programming cycle and starts directly with an erase pulse, the erase operation can be done at box 410 without any pre-programming cycle. Therefore, the erase operation performed by method 400 can be faster than the erase operation performed by a conventional method, and the memory cells experience less wear and tear. Therefore, the lifetime of the flash memory device is longer.

In one embodiment, method 400 is implemented as a series of programmable instructions that can be stored in controller 105 or state machine 130 of FIG. 1. State machine 130 is a sequential logic circuit having both logic gates and storage elements to implement method 400 directly in hardware. Other portions of the IC 110 may also be used to implement the method 400. For example, pump circuit 160 may be used to provide any voltages needed for the erase, soft-programming and pre-programming operations. The memory cell may be read by a sense amplifier in the sense amplifiers 156. The method 400 may also be implemented in other ways known to those skilled in the art.

Figure 5:
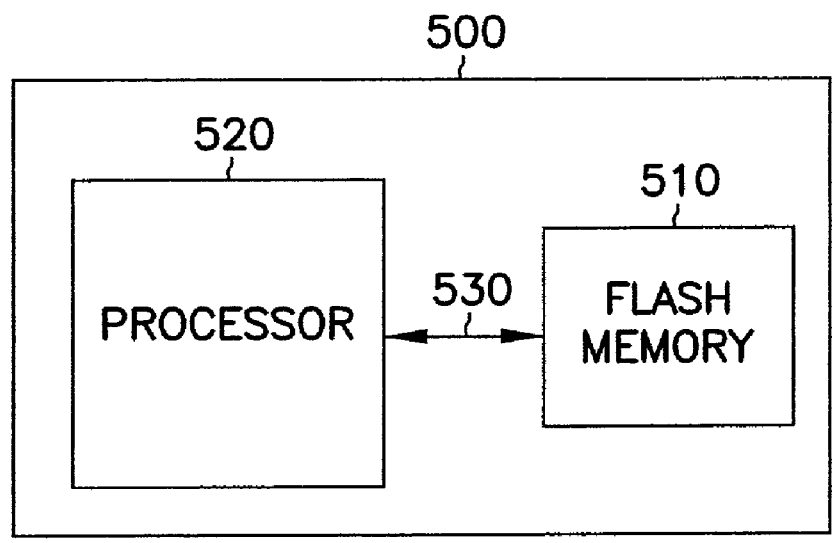
FIG. 5 shows an integrated circuit chip according to an embodiment of the invention.

FIG. 5 shows an integrated circuit chip according to an embodiment of the invention. Chip 500 includes an embedded flash memory 510 such as IC 110 of FIG. 1. The embedded flash memory 510 includes elements or instructions (or both) to implement the method 400 of FIG. 4. Flash memory 510 shares chip 500 with another integrated circuit 520 such as a processor. In other embodiments, chip 500 includes other integrated circuits besides processor 520 and flash memory 510. The embedded flash memory 510 and the integrated circuit 520 connect together by a suitable communication line or bus 530.

Figure 6:
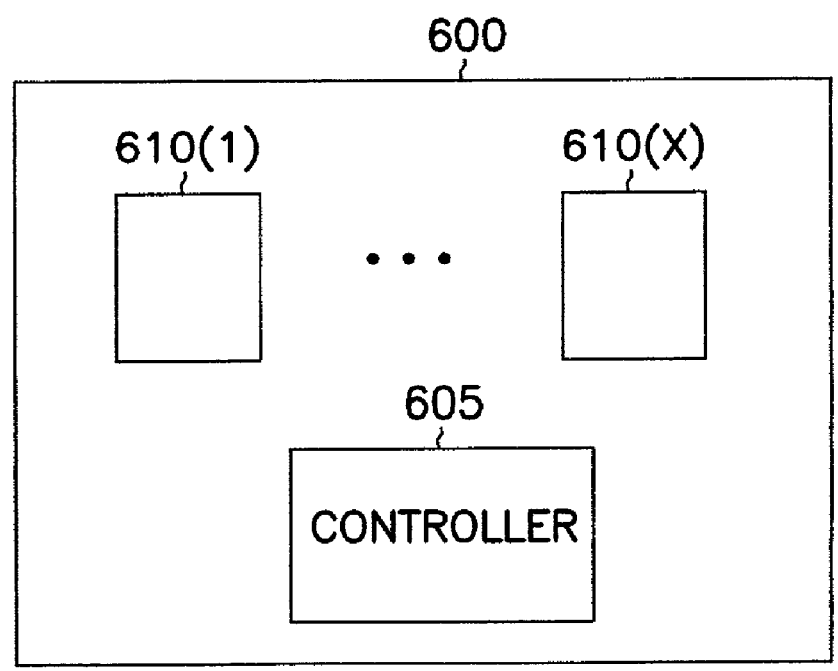
FIG. 6 shows a flash memory card according to an embodiment of the invention.

One skilled in the art having the benefit of this description will understand that more than one flash memory integrated circuit (IC) 110 of FIG. 1 may be included in various package configurations. FIG. 6 shows an example of a flash card 600 including a controller 605 and a plurality of flash memory integrated circuits 610(1)–610(X). Controller 605 is similar to controller 105 of FIG. 1. Each of the flash memory integrated circuits 610(1)–610(X) is similar to the flash memory integrated circuit (IC) 110 of FIG. 1. Flash card 600 may be a single integrated circuit in which controller 605 and flash memory integrated circuits 610(1)–610 (X) are embedded.

Figure 7:
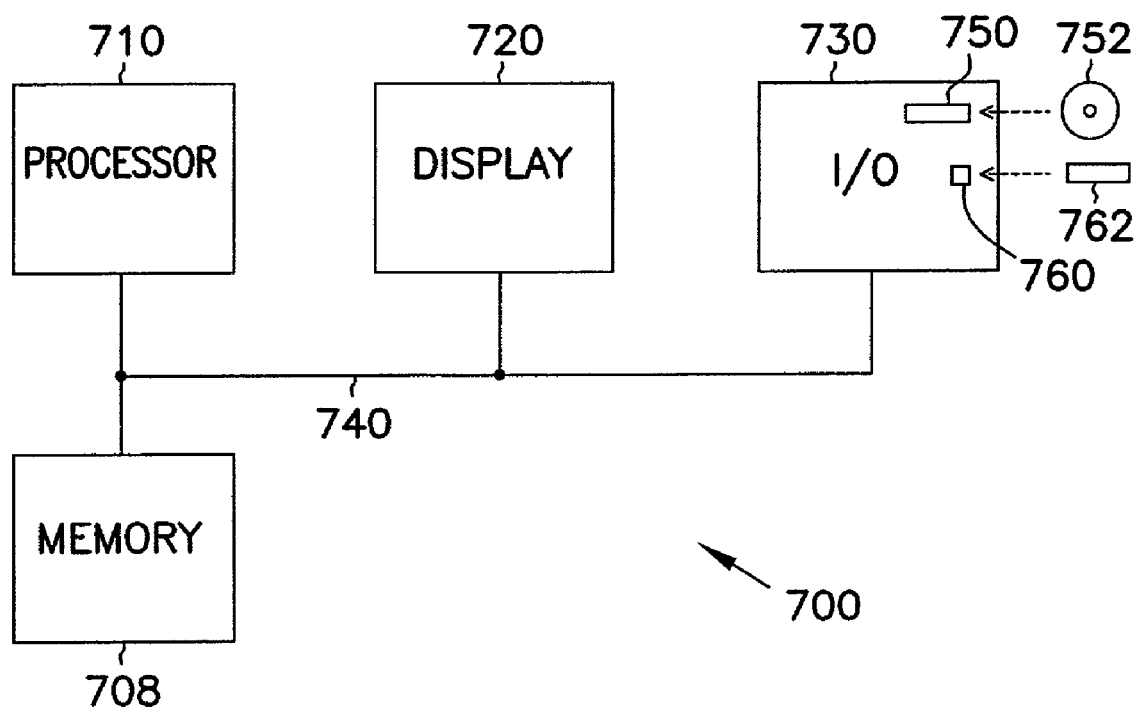
FIG. 7 is a block diagram of an information-handling system according to an embodiment of the invention.

FIG. 7 is a block diagram of an information-handling system 700 according to an embodiment of the invention. System 700 includes a memory system 708, a processor 710, a display unit 720, and an input/output (I/O) subsystem 730. Processor 710 may be, for example, a microprocessor. Memory system 708 includes flash memory integrated circuit (IC) 110 of FIG. 1. Memory system 708 includes elements or instructions to implement method 400 of FIG. 4. I/O subsystem 730 may be a keyboard or other device to allow the user to communicate with system 700. Processor 710 and memory system 708 may be embedded on a single integrated circuit chip such as the chip 500 of FIG. 5. Processor 710, display unit 720, I/O subsystem 730, and memory system 708 connect together by a suitable communication line or bus 740.

Information-handling system 700 further includes communication components 750 and 760 which can be parts of I/O subsystem 730. Communication component 750 is capable of communicating with a computer-readable medium 752. Computer-readable medium 752 may be floppy disk, CD-ROM, tape cartridge, or other storage media. In the embodiment of FIG. 7, computer-readable medium 752 stores instructions to cause system 700 to perform a method of erasing memory cells such as method 400 of FIG. 4. In other embodiments, computer-readable medium 752 stores instructions loaded into memory system 708 to cause memory system 708 to perform a method such as method 400 of FIG. 4.

Communication component 760 may be an interface element which can communicate with a transmission medium 762. Transmission medium 762 may be telephone line, a cable line, a fiber optic line, a wireless transmitter, or other transmission media. In the embodiment of FIG. 7, communication components 760 receives instructions transmitted via medium 762 to cause system 700 to perform a method of erasing memory cells such as method 400 of FIG. 4. In other embodiments, communication components 760 receives instructions transmitted via medium 762 such that the instructions are loaded into memory system 708 to cause memory system 708 to perform a method such as method 400 of FIG. 4.

In various embodiments of the invention, information-handling system 700 is a computer system such as a video game, a hand-held calculator, a television set-top box, a network computer, a hand-held computer, a personal computer, or a multiprocessor supercomputer. Information-handling system 700 can also be an information appliance such as a cellular telephone, a smart mobile phone, a pager, a daily planner or organizer, a personal digital assistant, or any wireless device. Further, information-handling system 700 is also an information component such as a magnetic disk drive or telecommunications modem, or other appliance such as a television, a hearing aid, washing machine or microwave oven having an electronic controller.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the invention. Therefore, it is intended that this invention be limited only by the claims and the equivalents thereof.

What is claimed is:

1. A method of operating a flash memory device, the method comprising:
    applying an erase pulse to erase a plurality of memory cells; and
    pre-programming the memory cells only if a leakage occurs after the memory cells are erased.

2. The method of claim 1, wherein pre-programming is performed if a leakage occurs at a number of memory cells and the number of memory cells having leakage exceeds a low limit and stays below a high limit.

3. The method of claim 2 further includes soft-programming the memory cells if the number of memory cells having leakage stays below the low limit.

4. The method of claim 3, wherein the low limit is three.

5. The method of claim 4, wherein the high limit is sixteen.

6. A method of operating a flash memory device, the method comprising:
    applying an erase pulse to erase a plurality of memory cells;
    soft-programming the memory cells if a leakage occurs and a number of memory cells having leakage stays below a low limit; and
    pre-programming the memory cells if a leakage occurs and the number of memory cells having leakage exceeds the low limit and stays below a high limit.

7. The method of claim 6, wherein applying an erase pulse includes changing the contents of the memory cells to logic 1 bits.

8. The method of claim 6, wherein pre-programning includes changing the contents of the memory cells to logic 0 bits.

9. The method of claim 6, wherein the low limit is three.

10. The method of claim 9, wherein the high limit is sixteen.

11. A method of operating a flash memory device, the method comprising:
    applying an erase pulse to erase a plurality of memory cells;
    verifying that all of the memory cells are erased;
    checking for a leakage among the memory cells;
    soft-programming the memory cells if a leakage occurs and a number of memory cells having leakage stays below a low limit; and
    pre-programming the memory cells if a leakage occurs and the number of memory cells having leakage exceeds the low limit and stays below a high limit.

12. The method of claim 11, wherein applying the erase pulse occurs before any pre-programming operation.

13. The method of claim 11, wherein checking for the leakage includes checking for a leakage of a memory cell.

14. The method of claim 11, wherein checking for the leakage includes checking for a leakage of a column of memory cells.

15. The method of claim 11, wherein checking for the leakage includes:
    reading a current of a memory cell; and
    comparing the current to a reference current.

16. The method of claim 11, wherein the low limit is three.

17. The method of claim 16, wherein the high limit is sixteen.

18. A method of operating a flash memory device, the method comprising:
    (a) applying an erase pulse to erase a plurality of memory cells;
    (b) verifying that all of the memory cells are erased;
    (c) checking for a leakage among the memory cells;
    (d) if a leakage occurs and a number of memory cells having leakage is less than a first predetermined quantity, then:
        soft-programming the memory cells having leakage; and
        continuing the method from element (b); and
    (e) if a leakage occurs and the number of memory cells having leakage is greater than the first predetermined quantity and less than a second predetermined quantity, then:
        pre-programming the memory cells; and
        continuing the method from element (a).

19. The method of claim 18, wherein checking for the leakage includes checking for a leakage of a column of memory cells.

20. The method of claim 18, wherein checking for the leakage includes:
    reading a current of a memory cell; and
    comparing the current to a reference current.

21. The method of claim 18, wherein the first predetermined quantity is three.

22. The method of claim 18, wherein the second predetermined quantity is sixteen.

23. A computer-readable medium having instructions stored therein to cause a flash memory device to perform a method of erasing memory cells in the flash memory device, the method comprising:
    applying an erase pulse to erase a plurality of memory cells; and
    pre-programming the memory cells only if a leakage occurs after the memory cells are erased.

24. The method of claim 23, wherein pre-programming is performed if a leakage occurs at a number of memory cells and the number of memory cells having leakage exceeds a low limit and stays below a high limit.

25. The method of claim 24 further includes soft-programming the memory cells if the number of memory cells having leakage stays below the low limit.

26. The method of claim 25, wherein the low limit is three.

27. The method of claim 26, wherein the high limit is sixteen.

* * * * *